US010460772B2

(12) United States Patent
Mori et al.

(10) Patent No.: US 10,460,772 B2
(45) Date of Patent: Oct. 29, 2019

(54) SEMICONDUCTOR DEVICE

(71) Applicants: KABUSHIKI KAISHA TOSHIBA, Minato-ku (JP); Toshiba Electronic Devices & Storage Corporation, Minato-ku (JP)

(72) Inventors: Takayuki Mori, Nagareyama (JP); Tatsuya Tokue, Yokohama (JP); Haruya Iwata, Kawasaki (JP); Sohei Kushida, Tokyo (JP); Satoshi Kamiya, Kawasaki (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/127,804

(22) Filed: Sep. 11, 2018

(65) Prior Publication Data
US 2019/0287577 A1 Sep. 19, 2019

(30) Foreign Application Priority Data

Mar. 16, 2018 (JP) ................ 2018-049323

(51) Int. Cl.
*G11C 5/14* (2006.01)
*G06F 13/362* (2006.01)
*G06F 13/40* (2006.01)
*G11C 11/34* (2006.01)

(52) U.S. Cl.
CPC .......... *G11C 5/148* (2013.01); *G06F 13/3625* (2013.01); *G06F 13/4022* (2013.01); *G11C 11/34* (2013.01)

(58) Field of Classification Search
CPC ..... G11C 5/148; G11C 11/34; G06F 13/3625; G06F 13/4022
USPC ....................................................... 365/174
See application file for complete search history.

(56) References Cited

U.S. PATENT DOCUMENTS

| | | | |
|---|---|---|---|
| 5,014,235 A | 5/1991 | Morton | |
| 6,069,834 A | 5/2000 | Watanabe et al. | |
| 7,813,171 B2 | 10/2010 | Shibata et al. | |
| 2012/0239842 A1* | 9/2012 | Nakano ............... | G06F 13/4022 710/300 |
| 2017/0262031 A1 | 9/2017 | Katayama | |

(Continued)

FOREIGN PATENT DOCUMENTS

| | | |
|---|---|---|
| JP | 06-502937 | 3/1994 |
| JP | 2006-139864 | 6/2006 |

(Continued)

*Primary Examiner* — Fernando Hidalgo
(74) *Attorney, Agent, or Firm* — Oblon, McClelland, Maier & Neustadt, L.L.P.

(57) ABSTRACT

According to one embodiment, there is provided a semiconductor device comprising: a control circuit connected to a bus; a first circuit operating under control of the control circuit; a bus access detection circuit that detects bus access from the control circuit to the first circuit without going through the bus; a switch element connected between the first circuit and a power supply; and a second circuit connected between the first circuit and the bus, the second circuit controlling, when the bus access to the first circuit is detected by the bus access detection circuit, the switch element such that power from the power supply is supplied to the first circuit.

16 Claims, 10 Drawing Sheets

(56) References Cited

U.S. PATENT DOCUMENTS

2017/0308152 A1* 10/2017 Trichy ................ G06F 13/4282
2018/0212796 A1* 7/2018 Kamihara ........... G06F 13/4022

FOREIGN PATENT DOCUMENTS

| JP | 2007-128651 | 5/2007 |
| JP | 2017-162407 | 9/2017 |

* cited by examiner

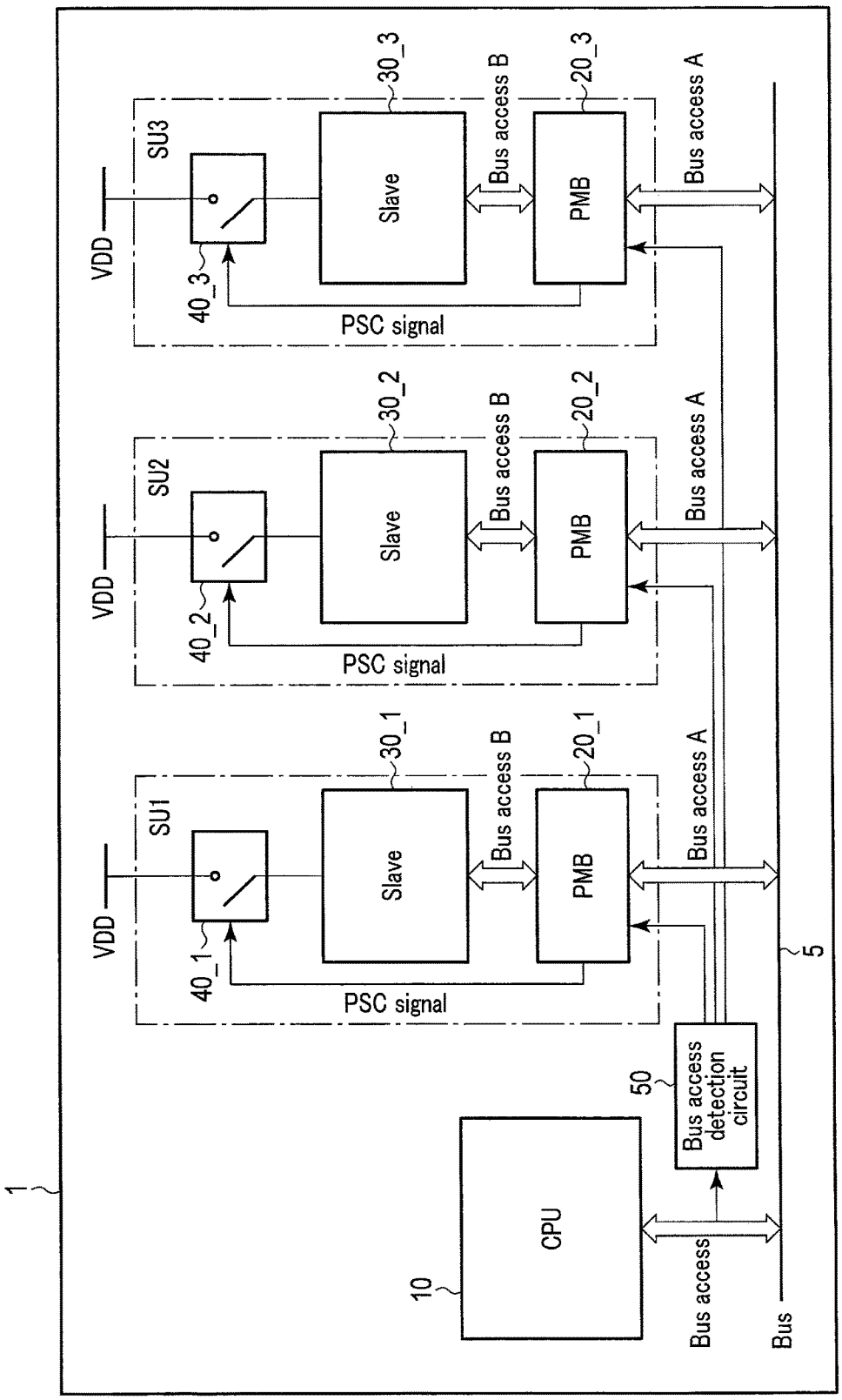
F I G. 1

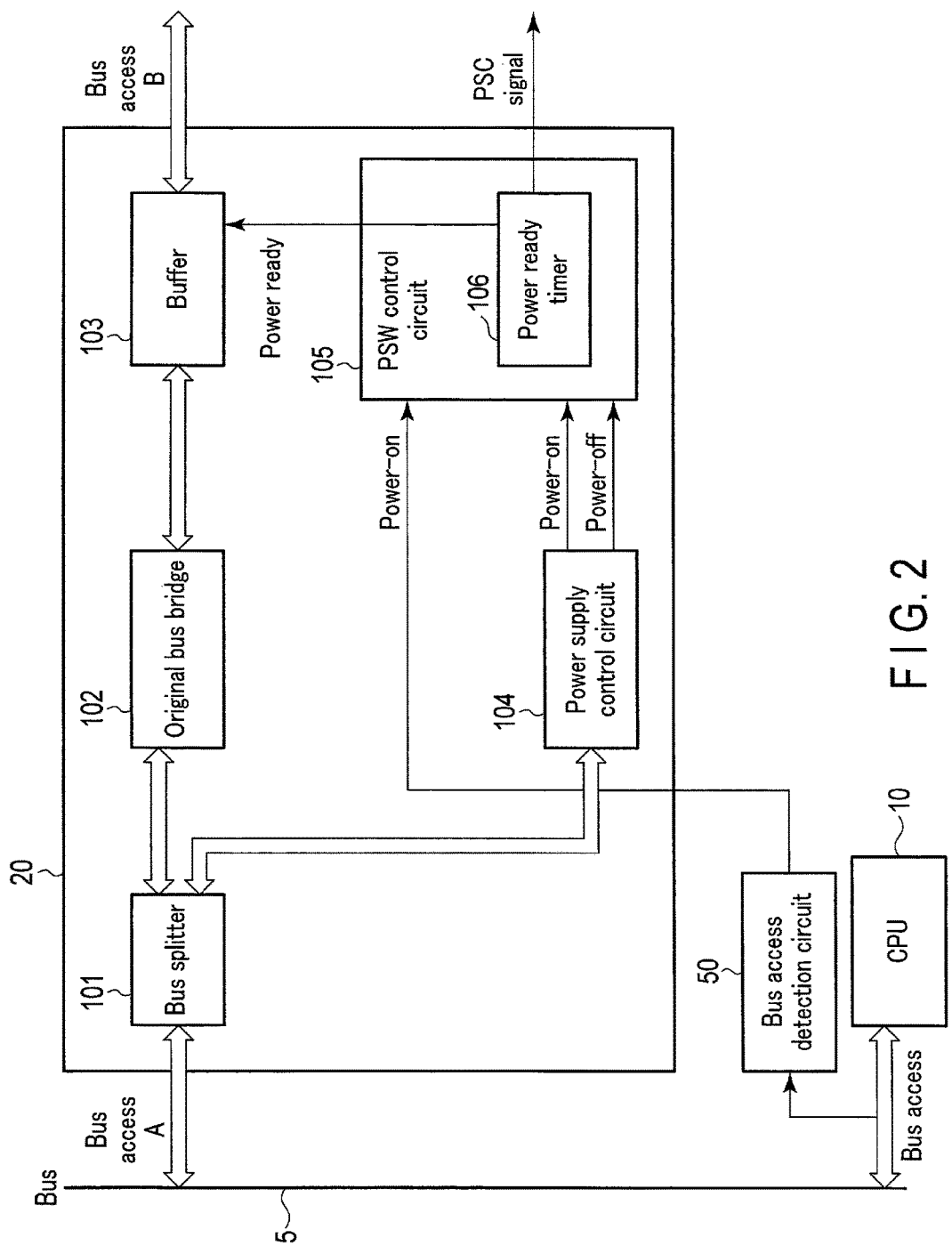
F I G. 2

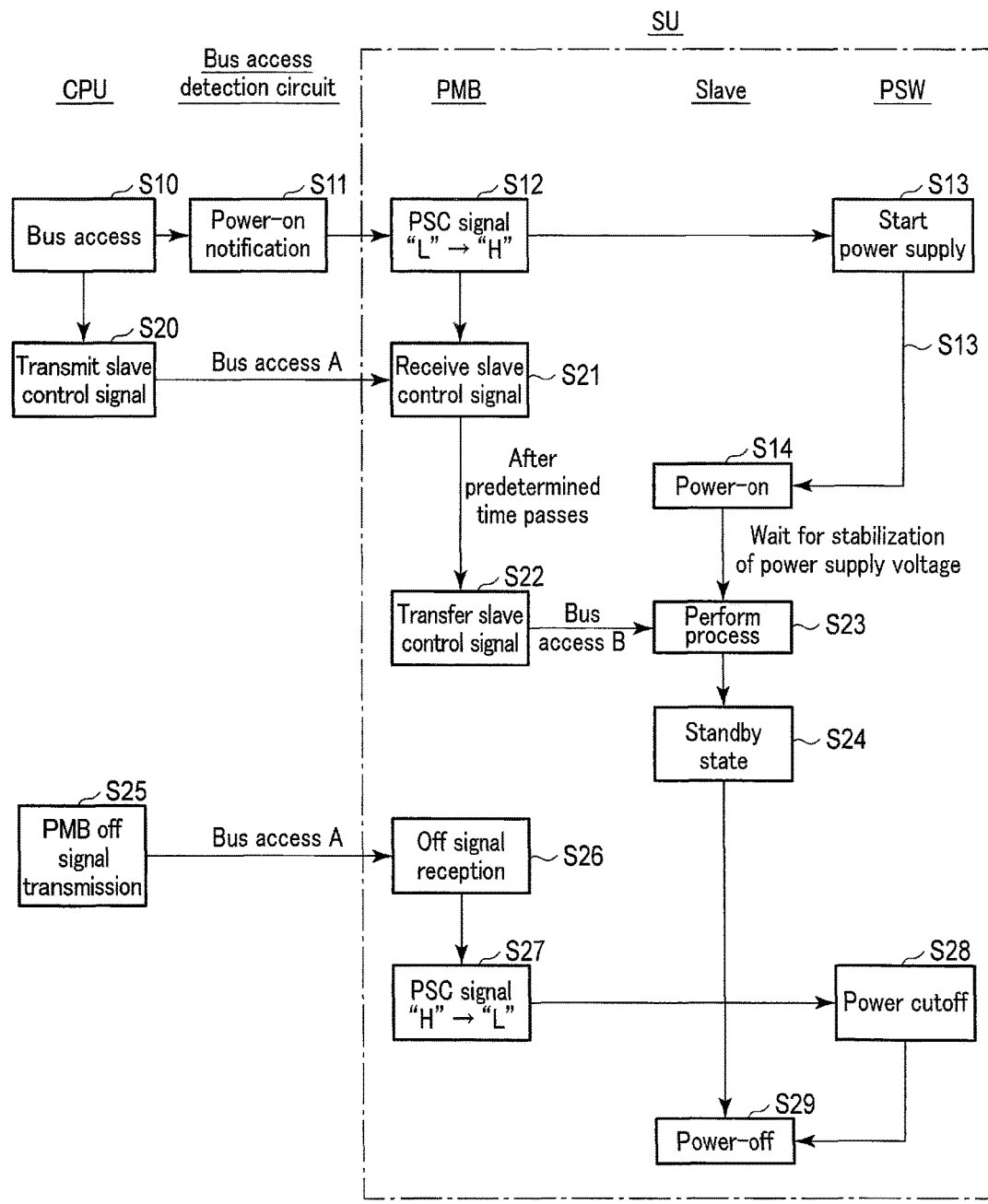
F I G. 3

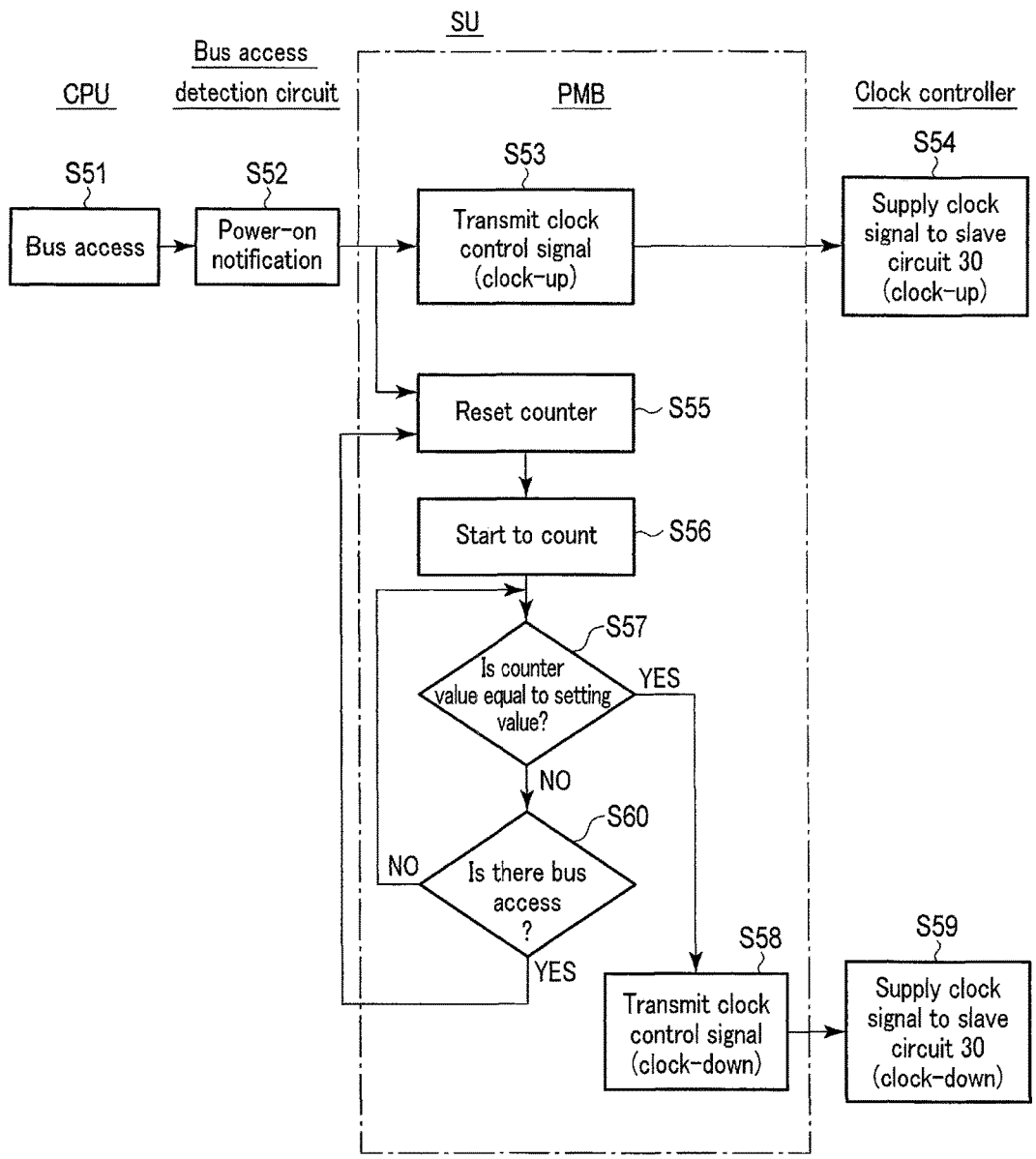
F I G. 7

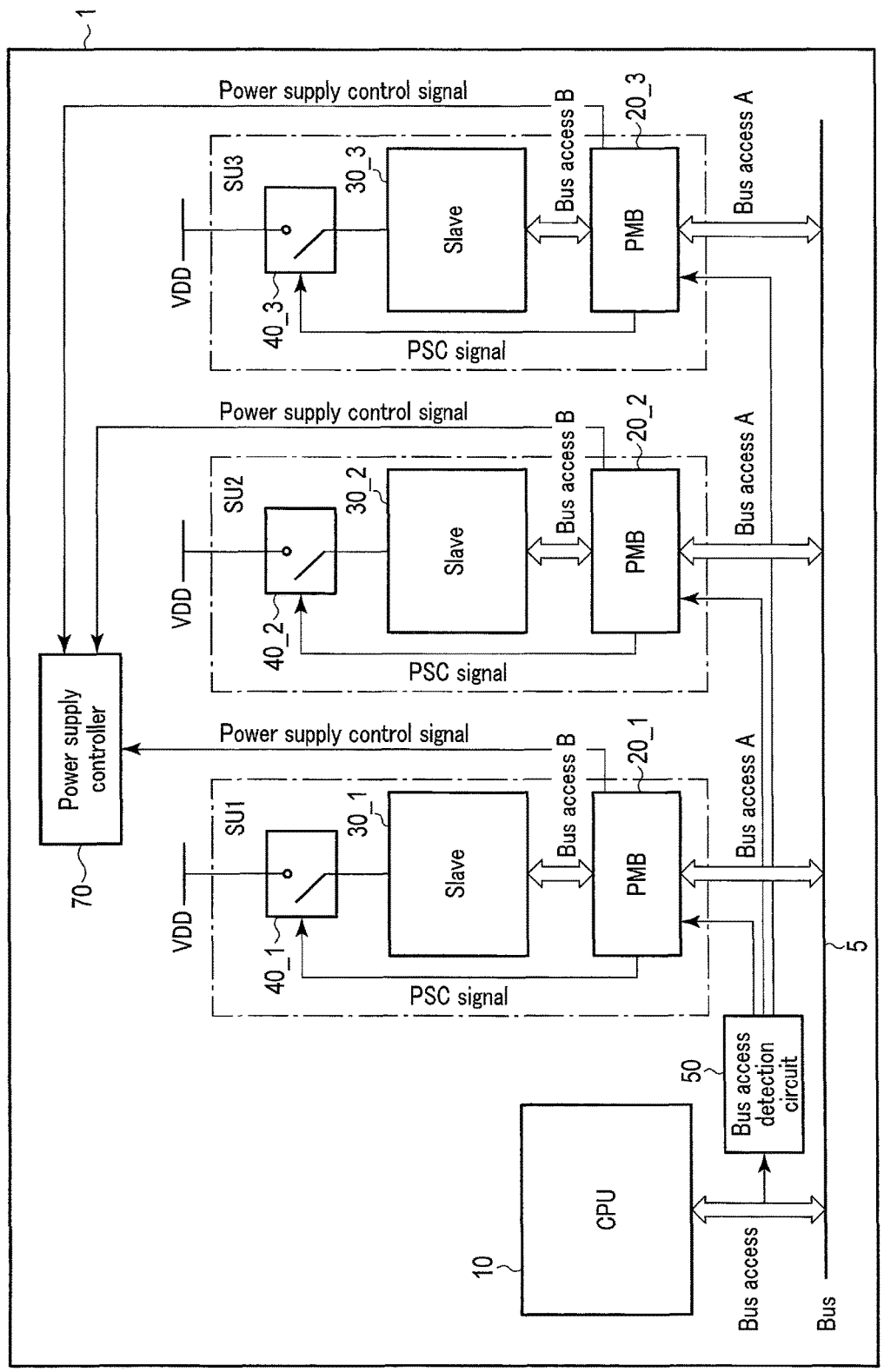
F I G. 8

SEMICONDUCTOR DEVICE

CROSS-REFERENCE TO RELATED APPLICATION

This application is based upon and claims the benefit of priority from Japanese Patent Applications No. 2018-49323, filed Mar. 16, 2018; the entire contents of which is incorporated herein by reference.

FIELD

Embodiments described herein relate generally to a semiconductor memory device.

BACKGROUND

In some semiconductor devices, a bus access detection circuit in a power management bridge (PMB) circuit has a power supply control function to a slave circuit as a partial circuit in the semiconductor device for the purpose of reducing power consumption while the circuit is not used.

In such a semiconductor device, when bus access to a slave circuit is issued while the slave circuit is off, the bus access detection circuit in the PMB circuit makes power-on notification to a power switch (PSW) control circuit.

Upon receiving the power-on notification, the PSW control circuit sends a power switch control (PSC) signal to the PSW circuit to turn on the slave circuit. In addition, the PMB circuit causes access from the bus to wait until the slave circuit is turned on and after a certain period of time during which the slave circuit is turned on and the power supply is stabilized passes, the access from the bus is conveyed to the slave side.

However, if it takes time until the slave circuit is turned on, it will take time before the access is completed. Therefore, when on/off frequently occurs in the power supply control, it takes time to access each time the slave circuit is turned on in an off state.

BRIEF DESCRIPTION OF THE DRAWING(S)

FIG. 1 is a block diagram showing an overall configuration of a semiconductor device according to an embodiment;

FIG. 2 is a block diagram of a PMB circuit 20 in a semiconductor device according to a first embodiment;

FIG. 3 is a flowchart showing access between a CPU and a slave unit SU in the semiconductor device according to the first embodiment;

FIG. 7 is a flowchart illustrating a frequency control operation of a clock signal supplied to a slave circuit 30 in the semiconductor device according to the second embodiment;

FIG. 8 is a block diagram showing the overall configuration of the semiconductor device according to a third embodiment;

DETAILED DESCRIPTION

Figure 4:
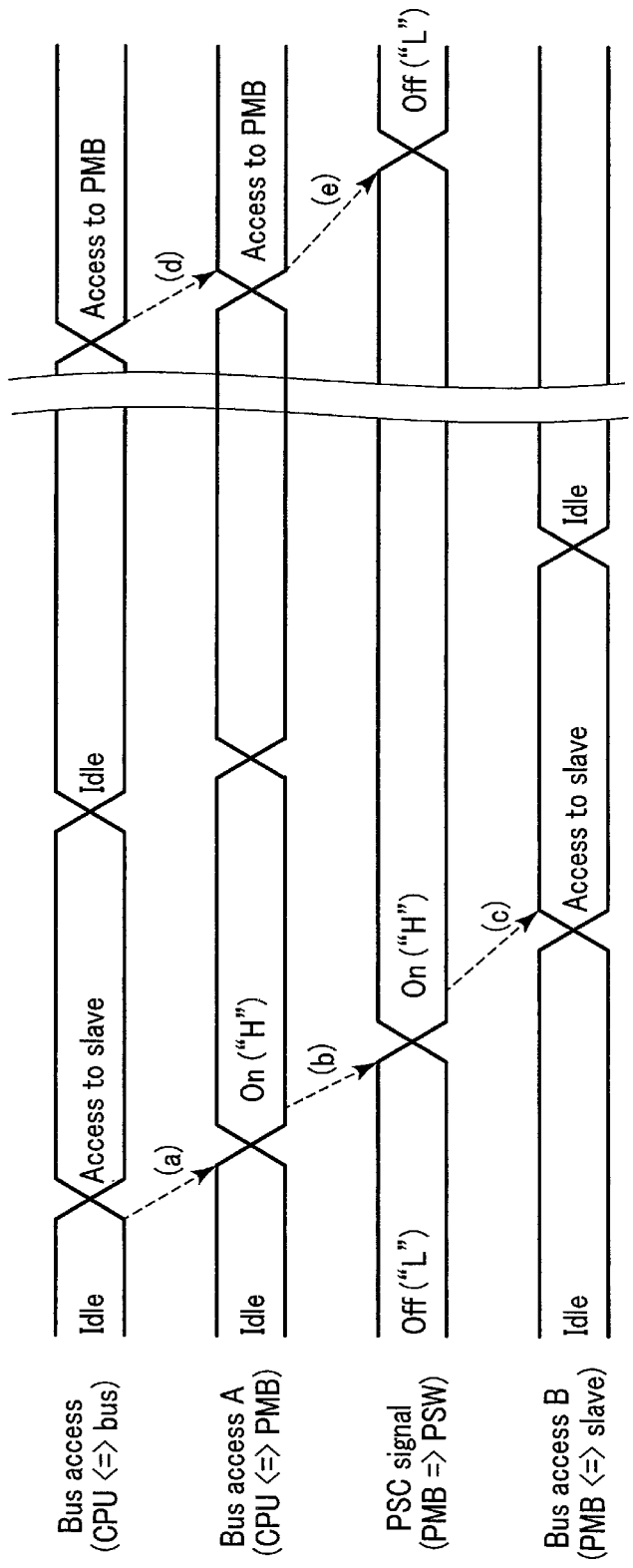
FIG. 4 is a timing chart of bus access in the semiconductor device according to the first embodiment.

According to an embodiment, there is provided a semiconductor device comprising: a control circuit connected to a bus; a first circuit operating under control of the control circuit; a bus access detection circuit that detects bus access from the control circuit to the first circuit without going through the bus; a switch element connected between the first circuit and a power supply; and a second circuit connected between the first circuit and the bus, the second circuit controlling, when the bus access to the first circuit is detected by the bus access detection circuit, the switch element such that power from the power supply is supplied to the first circuit.

Hereinafter, the embodiments will be described with reference to the drawings. In the description that follows, the same reference signs are attached to components having substantially the same function and configuration and a duplicate description is provided only when necessary. Each embodiment shown below exemplifies an apparatus or a method of embodying technical ideas of the embodiment and technical ideas of an embodiment do not limit the materials, shapes, structures, arrangements and the like of components to those described below. Technical ideas of an embodiment can be modified in various ways in claims.

Each functional block can be implemented as either hardware or computer software, or a combination of both. For this reason, each block will be described below generally in terms of its function, so that it becomes clear how the block is implemented. Whether such a function is executed as hardware or software depends on the specific implementation or design constraints imposed on the overall system. Those skilled in the art can implement these functions in various ways for each specific embodiment, but determining such implementation is included within the scope of the present invention.

In an embodiment, a bus access detection circuit is installed on a master side (CPU side), instead of inside a bus bridge (PMB circuit). Further, in an embodiment, a case where the semiconductor device is an LSI (large scale integration) will be described as an example.

1. First Embodiment

A semiconductor device according to a first embodiment will be described.

1.1 Configuration of Semiconductor Device

First, the configuration of a semiconductor device will be described.

FIG. 1 is a block diagram showing an overall configuration of a semiconductor device according to the first embodiment.

As shown in FIG. 1, an LSI 1 includes a CPU (central processing unit) 10 and three slave units SU1 to SU3. The number of slave units SU can be arbitrarily set.

Each slave unit SU is connected to the CPU 10 via an internal bus 5. Each slave unit SU includes a PMB (power management bridge) circuit 20, a slave circuit 30, and a PSW (power switch) circuit 40. Hereinafter, particularly when limiting the slave unit SU, the PMB circuit of a slave unit SU1 is set as 20_1, the slave circuit is set as 30_1, and the PSW circuit is set as 40_1. Similarly, the PMB circuit of a slave unit SU2 is set as 20_2, the slave circuit is set as 30_2, and the PSW circuit is set as 402. Also, the PMB circuit of a slave unit SU3 is set as 203, the slave circuit is set as 303, and the PSW circuit is set as 403.

The PMB circuit 20 is connected between the internal bus 5 and the slave circuit 30. Further, the PMB circuit 20 is connected to the PSW circuit 40 to transmit a control signal (PSC (power switch control) signal) to the PSW circuit 40. The PMB circuit 20 has a bus bridge function that relays access between the slave circuit 30 and the internal bus 5 and a power supply control function of the slave circuit 30.

The bus bridge function will be described more specifically. The access via the bus (hereinafter, referred to as "bus access") between the CPU 10 and the slave circuit 30 is performed via the PMB circuit 20. Hereinafter, the access between the PMB circuit 20 and the internal bus 5 is referred to as bus access A, and the access between the PMB circuit 20 and the slave circuit 30 is defined as bus access B.

The PMB circuit 20 has a function of causing the response of the bus access to wait as one of the bus bridge functions. In the embodiment, when the slave circuit 30 is accessed by the CPU 10 or when a bus access detection circuit 50 provided on the CPU 10 side detects bus access to the slave circuit 30 of the CPU 10, the PMB circuit 20 is notified of power-on without going through the internal bus 5. Upon receiving the power-on notification from the bus access detection circuit 50, the PMB circuit 20 turns on the slave circuit 30. That is, the PMB circuit 20 turns on the PSW circuit 40 and accesses the slave circuit 30 after a predetermined time has elapsed (bus access B). That is, upon receiving the power-on notification, the PMB circuit 20 turns on the slave circuit 30 and then, delays a control signal (hereinafter, referred to as a "slave control signal") of the CPU 10 for a predetermined time before transmitting the slave control signal to the slave circuit 30.

In addition, the PMB circuit 20 has a function as an asynchronous bridge. For example, when the CPU 10 and the slave circuit 30 operate on different clocks, the PMB circuit 20 transmits a slave control signal (such as a command, an address, data, etc.) sent from the CPU 10 via the internal bus 5 to the slave circuit 30 after the control signal being synchronized with the clock of the slave circuit 30. Similarly, when a signal is transmitted from the slave circuit 30 to the CPU 10, the PMB circuit 20 transmits the signal received from the slave circuit 30 to the CPU 10 (internal bus 5) in synchronization with the clock of the CPU 10.

Further, if the bus protocol in the bus access A and that in the bus access B are different, the PMB circuit 20 has a protocol conversion function. Hereinafter, a case where the CPU 10 and the slave circuit 30 operate on the same clock and the bus protocol in the bus access A and that in the bus access B are the same will be described as an example. In that case, the asynchronous bridge function and the protocol conversion function can be omitted.

Next, the power supply control function of the slave circuit 30 of the PMB circuit 20 will be described more specifically. The PMB circuit 20 transmits a PSC signal to the PSW circuit 40 to control the PSW circuit 40. The PSC signal is a signal to control the on/off state of the PSW circuit 40. When the bus access detection circuit 50 detects the bus access of the CPU 10 to the slave circuit 30 on the CPU 10 side, the PMB circuit 20 turns on the PSW circuit 40 using the power-on notification made without going through the internal bus 5 as a trigger. Accordingly, a power supply voltage VDD is supplied to the slave circuit 30. That is, the PMB circuit 20 controls the supply of the power supply voltage VDD to the slave circuit 30 by controlling the PSW circuit 40 without going through the internal bus 5.

Further, the PMB circuit 20 according to the first embodiment includes a control register (not shown) to control the PSW circuit 40. The PMB circuit 20 turns off the PSW circuit 40 in response to, for example, software control, that is, access from the CPU 10 to the control register inside the PMB circuit 20 and turns off the slave circuit 30 by cutting off the supply of the power supply voltage VDD to the slave circuit 30.

The slave circuit 30 performs various processes by controlling the CPU 10. The slave circuit 30 may be turned off while not used. It should be noted that the slave circuits 30_1 to 30_3 may have mutually different circuit configurations that perform different processes. Further, the slave circuit 30 is not particularly limited as long as the circuit is controlled by the CPU 10 and can be turned off while not used. For example, the slave circuit 30 may be an arithmetic circuit, a memory circuit, or a control circuit that controls external devices.

The PSW circuit 40 includes a switching element (for example, a transistor) that connects the power supply voltage line to which the power supply voltage VDD is supplied and the slave circuit 30. For example, while the PSC signal is at the "H" level, the PSW circuit 40 is in the on state (the switching element is in the conducting state) and supplies the power supply voltage VDD to the slave circuit 30. Hereinafter, a case where the PSW circuit 40 (switching element) is turned on when the PSC signal is at the "H" level will be described. Incidentally, when the PSC signal is at the "L" level, the PSW circuit 40 may be turned on.

The CPU 10 is a control circuit that administers various kinds of control in the LSI 1 in response to commands from external devices. For example, when the slave circuit 30 is not used, the CPU 10 in the first embodiment cuts off the supply of the power supply voltage VDD to the slave circuit 30.

The bus access detection circuit 50 is provided on the CPU 10 side, detects the bus access from the CPU 10 to the slave circuit 30 on the CPU 10 side without going through the internal bus 5, and notifies all the PMB circuits 20 of power-on without going through the internal bus 5.

1.2 Configuration of PMB Circuit

Next, the configuration of the PMB circuit 20 will be described.

FIG. 2 is a block diagram of the PMB circuit 20 in the semiconductor device according to the first embodiment.

As shown in FIG. 2, the PMB circuit 20 includes a bus splitter circuit 101, an original bus bridge circuit 102, a buffer 103, a power supply control circuit 104, and a PSW control circuit 105.

The bus splitter circuit 101 is connected to the internal bus 5 (bus access A), the original bus bridge circuit 102, and the power supply control circuit 104. The bus splitter circuit 101 separates the bus access from the CPU 10 to the control register inside the PMB circuit 20 and the bus access to the slave circuit 30. More specifically, when the CPU 10 accesses the control register inside the PMB circuit 20, the bus splitter circuit 101 transmits a signal input from the CPU 10 (hereinafter referred to as a "PMB control signal") to the power supply control circuit 104. On the other hand, when the CPU 10 accesses the slave circuit 30, the bus splitter circuit 101 transmits a slave control signal input from the CPU 10 to the original bus bridge circuit 102.

The original bus bridge circuit 102 is connected to the buffer 103. The original bus bridge circuit 102 has a bus bridge function and when, for example, the bus access A and the bus access B have different bus protocol, protocol conversion is performed. It should be noted that the original bus bridge circuit 102 may be omitted.

The buffer 103 is connected to the slave circuit 30 (bus access B). The buffer 103 is a circuit to cause the bus access from the CPU 10 to the slave circuit 30 to wait (to delay the transmission of a slave control signal). For example, the buffer 103 causes the bus access to wait until the power supply is stabilized after the slave circuit 30 is turned on. When a power ready signal transmitted from the PSW control circuit 105 is asserted, the buffer 103 starts to access the slave circuit 30. The power ready signal is a signal indicating that the slave circuit 30 is in an on state and the power supply is in a stable state.

Upon detecting bus access from the CPU 10 to the slave circuit 30, the bus access detection circuit 50 instructs the PSW control circuit 105 to turn on the slave circuit 30 without going through the internal bus 5 (power-on notification). That is, the bus access detection circuit 50 instructs the PSW control circuit 105 to switch the PSC signal from the "L" level to the "H" level.

The power supply control circuit 104 is connected to the PSW control circuit 105. The power supply control circuit 104 has a control register to control on/off of the PSW circuit 40, that is, the slave circuit 30 (switching of the "H" level and "L" level of the PSC signal) by software. The power supply control circuit 104 instructs the PSW control circuit 105 to turn on or off the PSW circuit 40 in accordance with the value of the control register.

The PSW control circuit 105 transmits a PSC signal to the PSW circuit 40. More specifically, the PSW control circuit 105 sets a PSC signal to the "H" level in response to a command from the bus access detection circuit 50 or the power supply control circuit 104, and sets a PSC signal to the "L" level in response to a command from the power supply control circuit 104.

The PSW control circuit 105 also includes a power ready timer 106.

The power ready timer 106 controls the period from turning on the slave circuit 30, that is, from when the PSC signal is switched from the "L" level to the "H" level until the power ready signal is asserted. That is, the power ready timer 106 controls the power supply stabilization period in the slave circuit 30. In the first embodiment, the bus access detection circuit 50 can quickly detect the timing of bus access and as a result, the time when the slave circuit 30 is turned on can be brought forward, so that the power supply stabilization period can be shortened.

1.3 Access Operation from CPU to Slave Circuit

Next, an access operation from the CPU 10 to the slave circuit 30 will be described.

1.3.1 Overall Flow of Access Operation

First, the flow of an overall access operation will be described. Hereinafter, in order to simplify the description, a case where a slave control signal is transmitted from the CPU 10 to the slave circuit 30 will be described, and the description of a signal transmitted from the slave circuit 30 to the CPU 10 will be omitted.

FIG. 3 is a flowchart showing access between the CPU 10 and the slave unit SU in the semiconductor device according to the first embodiment. FIG. 3 more specifically shows how the PMB circuit 20, the slave circuit 30, and the PSW circuit 40 in the slave unit SU operate in accordance with a signal transmitted from the CPU 10 to the slave unit SU.

As shown in FIG. 3, the CPU 10 first accesses the internal bus 5 (bus access A) (S10). At this point, the bus access detection circuit 50 detects the access to the internal bus 5 by the CPU 10 on the side of the CPU 10 without going through the internal bus 5 and if the access is detected, the bus access detection circuit 50 notifies the PMB circuit 20 of power-on without going through the internal bus 5 (S11). Upon being notified of power-on by the bus access detection circuit 50, the PMB circuit 20 transmits a PSC signal to turn on the PSW circuit 40 (S12). More specifically, the PSC signal is switched from the "L" level to the "H" level and transmitted to the PSW circuit 40. In addition, the PSW control circuit 105 of the PMB circuit 20 starts to count the power ready timer 106.

Upon receiving the PSC signal to turn on the PSW circuit 40 from the PMB circuit 20, the PSW circuit 40 is turned on to supply the power supply voltage VDD to the slave circuit 30 (step S13). Accordingly, the slave circuit 30 is turned on (step S14).

After the bus access (S10), the CPU 10 starts to transmit a slave control signal to the slave unit SU (step S20). The slave control signal includes, for example, a command, address information, data and the like.

Next, the PMB circuit 20 receives the slave control signal via the internal bus 5 in the slave unit SU (step S21: bus access A). The bus splitter circuit 101 in the PMB circuit 20 transfers the slave control signal to the original bus bridge circuit 102. Next, the PMB circuit 20 accesses (bus access B) the slave circuit 30 after a predetermined time has elapsed after switching the PSC signal from the "L" level to the "H" level to transfer the slave control signal (step S22). More specifically, when the count value reaches a preset value, the power ready timer 106 asserts a power ready signal within the PMB circuit 20. The buffer 103 transfers the slave control signal to the slave circuit 30 in accordance with the power ready signal.

Next, the slave circuit 30 performs a process according to the slave control signal (step S23).

Next, when the process by the slave circuit 30 is completed and the slave circuit 30 enters a standby state (step S24), the CPU 10 transmits an off signal to turn off the slave circuit 30 to the PMB circuit 20 (Step S25).

Next, when the off signal is received (step S26), the PMB circuit 20 switches the PSC signal to be transmitted to the PSW circuit 40 from the "H" level to the "L" level (step S27). More specifically, within the PMB circuit 20, the bus splitter circuit 101 transfers the off signal to the power supply control circuit 104. In response to the off signal, the power supply control circuit 104 instructs the PSW control circuit 105 to turn off the PSW circuit 40. The PSW control circuit 105 switches the PSC signal from the "H" level to the "L" level in accordance with the instruction of the power supply control circuit 104.

Next, when the PSC signal is switched from the "H" level to the "L" level, the PSW circuit 40 is turned off and stops the supply of the power supply voltage VDD to the slave circuit 30 (step S28). Accordingly, the slave circuit 30 is turned off (step S29).

1.3.2 Timing of Bus Access

Next, the timing of bus access will be described. FIG. 4 is a timing chart of bus access in the semiconductor device according to the first embodiment.

As shown in FIG. 4, the bus access from the CPU 10 to the slave circuit 30 is performed ((a) in FIG. 4) and then, the bus access (bus access A) to the slave circuit 30 is performed via the internal bus 5 between the CPU 10 and the PMB circuit 20 ((b) in FIG. 4).

When the bus access from the CPU 10 to the slave circuit 30 is performed, the bus access detection circuit 50 detects access to the slave circuit 30 by the CPU 10 and notifies the PMB circuit 20 of power-on. When notified of power-on by the bus access detection circuit 50, the PMB circuit 20 switches the PSC signal, for example, from the "L" level to the "H" level to turn on the PSW circuit 40 ((c) in FIG. 4).

Accordingly, the slave circuit 30 is supplied with the power supply voltage VDD and turned on. Then, the PMB circuit 20 starts to access the slave circuit 30 in the bus access B when a predetermined time passes after switching the PSC signal from the "L" level to the "H" level ((c) in FIG. 4).

After the work of the slave circuit 30 is finished, the CPU 10 accesses the power supply control circuit 104 in the PMB circuit 20. More specifically, upon receiving, for example, the PMB control signal (off signal) from the CPU 10 in the bus access A, the PMB circuit 20 switches the PSC signal from the "H" level to the "L" level to turn off the PSW circuit 40 ((d) and (e) in FIG. 4). Accordingly, the slave circuit 30 is turned off by the supply of the power supply voltage VDD being cut off.

1.4 Effect According to the First Embodiment

According to the semiconductor device in the first embodiment, by detecting the bus access by the bus access detection circuit 50 when access from the master (CPU) to the internal bus 5 is issued, a PSC signal instructing power-on from the PMB circuit 20 to the slave circuit 30 can be output to the PSW circuit 40 earlier than a conventional case where the bus access detection circuit is provided in the PMB circuit 20.

Therefore, in a system having bus latency larger than the time until the slave circuit 30 is turned on and becomes accessible, the slave circuit can be accessed when access is received by the PMB circuit 20 and so access to the slave circuit 30 can be issued without causing the bus to wait.

That is, according to the first embodiment, the slave circuit 30 can be turned on without being affected by the bus latency so that the time to wait for access can be shortened.

1.5 Modification of the First Embodiment

The bus access from the CPU 10 includes the address of the slave circuit 30 to be accessed. The bus access detection circuit 50 may detect the address of the slave circuit 30 included in the bus access and notify only the slave circuit 30 to be accessed of power-on.

In addition, though the case where the bus access detection circuit 50 is provided in common to each slave unit SU has been described, the bus access detection circuit 50 may be provided for each slave unit SU.

2. Second Embodiment

The semiconductor device according to a second embodiment will be described.

2.1 Configuration of Semiconductor Device

In the first embodiment, when a slave circuit 30 is switched from the on state to the off state, a CPU 10 transmits an off signal to a PMB circuit 20 and the PMB circuit 20 controls a PSW circuit 40 so that the slave circuit 30 is turned off. When the slave circuit 30 is switched from the off state to the on state, the PMB circuit 20 controls the PSW circuit 40 so that the slave circuit 30 is turned on.

In the second embodiment, the PMB circuit 20 outputs a clock control signal to a clock controller that controls a clock signal supplied to the slave circuit 30 to control the frequency of the clock signal supplied to the slave circuit 30. Hereinafter, only differences from the first embodiment will be described.

Figure 5:
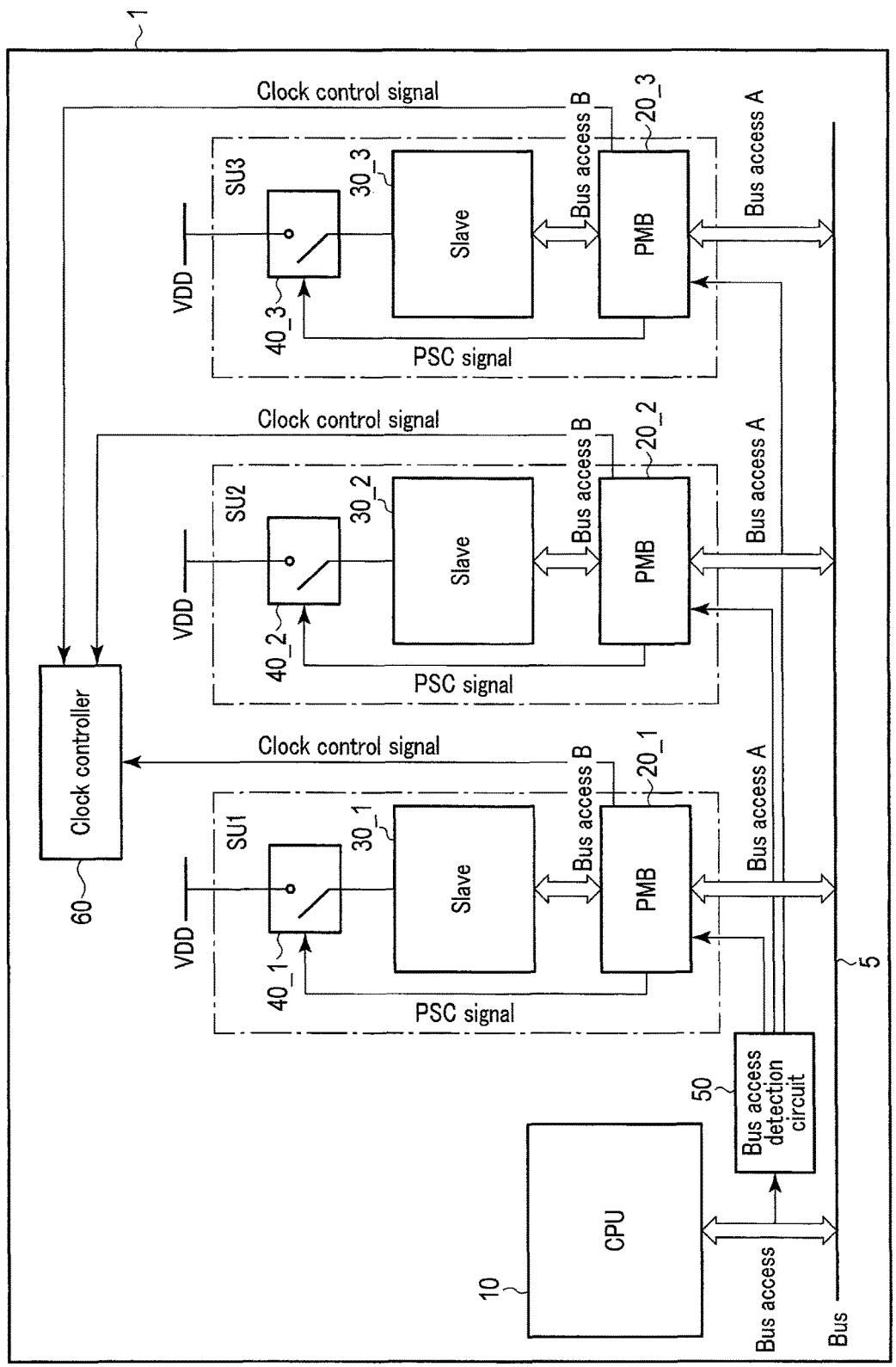
FIG. 5 is a block diagram showing the overall configuration of the semiconductor device according to a second embodiment.

FIG. 5 is a block diagram showing the overall configuration of the semiconductor device according to the second embodiment. Incidentally, the same reference signs are attached to the same components as those in FIG. 1 and a duplicate description thereof is omitted.

As shown in FIG. 5, a clock controller 60 is connected to the PMB circuit 20 of each slave unit SU to control the frequency of the clock signal supplied to the slave circuit 30 of each slave unit SU.

The PMB circuit 20 of each slave unit SU has a register (not shown) indicating whether or not a corresponding slave circuit 30 is a circuit that takes time for power-on. In the case of a circuit in which the slave circuit 30 does not take time to turn on (for example, the time until the power-on state of the slave circuit 30 is less than the predetermined time), the on/off control of the power supply according to the first embodiment is exercised. When the slave circuit 30 is a circuit that takes time to turn on (for example, the time until the power-on state of the slave circuit 30 is longer than a predetermined time), the frequency control of the clock signal supplied to the slave circuit 30 according to the second embodiment is exercised. In the second embodiment shown in FIG. 5, it is assumed that the slave circuits 30_1 to 30_3 are circuits which take time to turn on.

Figure 6:
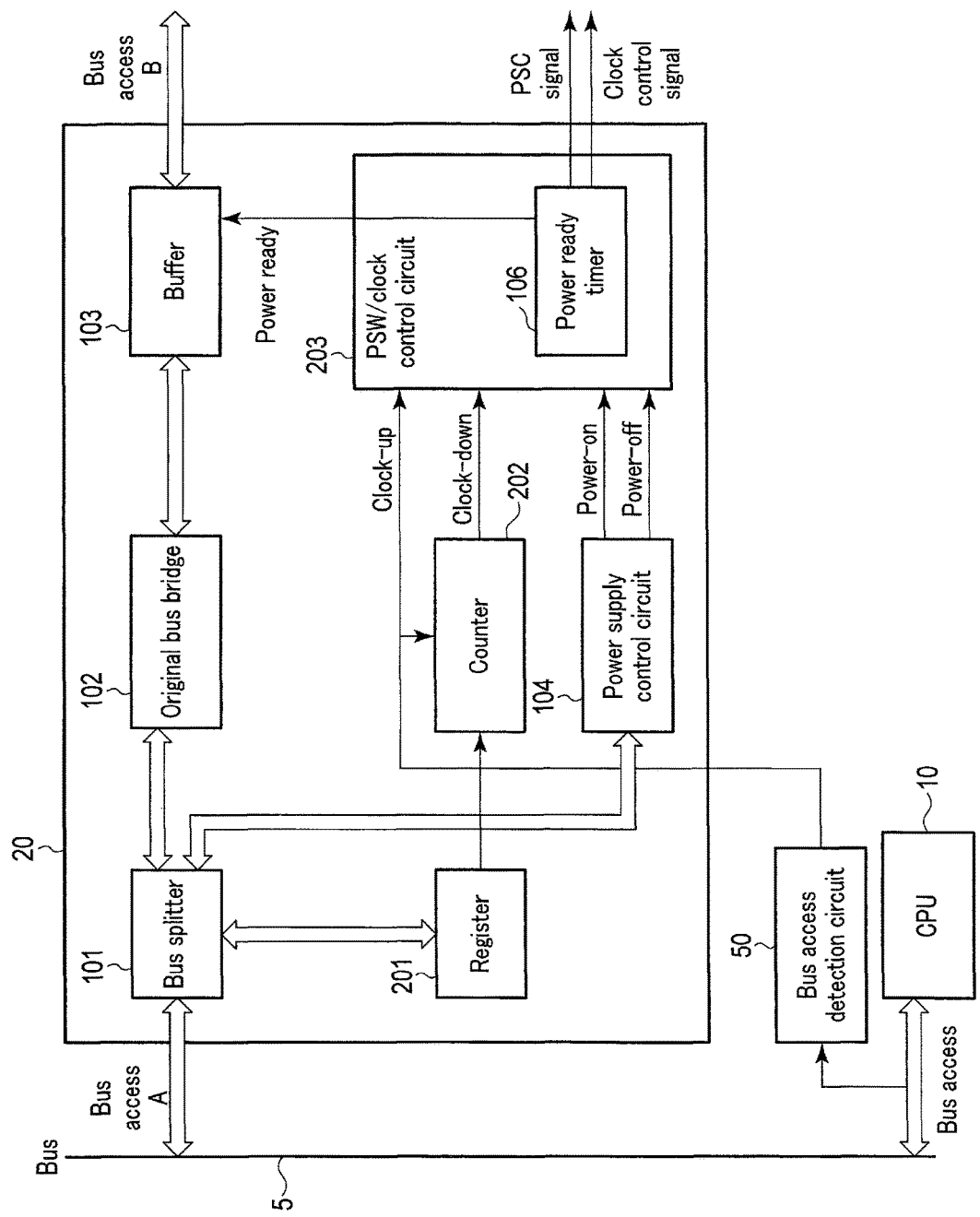
FIG. 6 is a block diagram of a PMB circuit 20 in the semiconductor device according to the second embodiment.

2.2 Configuration of PMB Circuit FIG. 6 is a block diagram of the PMB circuit 20 in the semiconductor device according to the second embodiment.

As shown in FIG. 6, the PMB circuit 20 includes a bus splitter circuit 101, an original bus bridge circuit 102, a buffer 103, a PSW/clock control circuit 203, a configuration register 201, and an idle time counter 202.

The bus splitter circuit 101 is connected to an internal bus 5 (bus access A), the original bus bridge circuit 102, the power supply control circuit 104, and the configuration register 201. When the CPU 10 transmits a PMB control signal, the bus splitter circuit 101 transmits the PMB control signal to the configuration register 201.

The configuration register 201 is connected to the idle time counter 202. The configuration register 201 is a register that holds various settings in the PMB circuit 20. For example, in the configuration register 201, an idle time configuration is set by software (CPU 10). The idle time configuration is a setting value of the idle period from when the slave circuit 30 is put into an idle state to when the power is turned off. When the idle time configuration is changed, the configuration register 201 transmits a new setting value to the idle time counter 202.

The idle time counter 202 is connected to the PSW control circuit 105. The idle time counter 202 is a counter for measuring the length of the idle period. The idle time counter 202 first initializes the counter in accordance with a count start instruction (power-on notification) from the bus access detection circuit 50, and then starts to count. If there is an instruction to start to count again from the bus access detection circuit 50 during counting, the count is restarted. The idle time counter 202 initializes the count value again and then starts to count. When the count value reaches the setting value, the idle time counter 202 stops counting and instructs the PSW/clock control circuit 203 to change the clock signal supplied to the slave circuit 30 to a frequency (second frequency) lower than the frequency (first frequency) of the clock signal supplied when the slave circuit 30 is in a power-on state.

Based on an instruction from the idle time counter 202, the PSW/clock control circuit 203 outputs a clock control signal (clock-down) that changes the clock signal supplied to the slave circuit 30 to a second frequency lower than the first frequency to the clock controller 60. Accordingly, the slave circuit 30 is supplied with a clock signal having a frequency lower than that in the power-on state.

When notified of power-on by the bus access detection circuit 50, the PSW/clock control circuit 203 transmits a clock control signal instructing to change the frequency of the clock signal supplied to the slave circuit 30 to the first frequency higher than the second frequency (clock-up) to the clock controller 60.

Upon receiving a clock-down control signal from the PSW/clock control circuit 203, the clock controller 60 changes the frequency of the clock signal supplied to the slave circuit 30 from the first frequency to the second frequency, and upon receiving a clock-up control signal, the clock controller 60 changes the frequency of the clock signal supplied to the slave circuit 30 from the second frequency to the first frequency.

2.3 Operation of Frequency Control of Clock Signal Supplied to Slave Circuit

FIG. 7 is a flowchart illustrating the operation of frequency control of the clock signal supplied to the slave circuit 30 in the semiconductor device according to the second embodiment.

The CPU 10 accesses the internal bus 5 (bus access A) (S51). When the bus access detection circuit 50 detects the access to the internal bus 5 by the CPU 10 on the CPU 10 side without going through the internal bus 5 and the access is detected, the bus access detection circuit 50 notifies the PMB circuit 20 of power-on without going through the internal bus 5 (S52).

When the PMB circuit 20 receives the power-on notification from the bus access detection circuit 50, the PSW/clock control circuit 203 of the PMB circuit 20 transmits a clock-up control signal instructing to change the frequency of the clock signal supplied to the slave circuit 30 from the second frequency to the first frequency to the clock controller 60 (S53). Upon receiving the clock control signal (clock-up) from the PSW/clock control circuit 203, the clock controller 60 changes the frequency of the clock signal supplied to the slave circuit 30 from the second frequency to the first frequency (S54).

When notified of power-on by the bus access detection circuit 50 in S52, the idle time counter 202 of the PMB circuit 20 is initialized (S55), and the counting of the idle time counter 202 is started (S56). That is, when notified of power-on, the process of transmitting the clock-up control signal to the clock controller 60 in S53 and the process of initializing the idle time counter 202 in S55 may be performed in parallel.

When the count value reaches the setting value (YES in S57), the idle time counter 202 stops counting and instructs the PSW/clock control circuit 203 to change the frequency of the clock signal supplied to the slave circuit 30 to the second frequency lower than the first frequency.

The PSW/clock control circuit 203 outputs a clock control signal (clock-down) to the clock controller 60 based on an instruction from the idle time counter 202 (S58).

Upon receiving the clock control signal (clock-down) from the PSW/clock control circuit 203, the clock controller 60 changes the frequency of the clock signal supplied to the slave circuit 30 from the first frequency to the second frequency (S59).

If the counter value is less than the setting value (NO in S57) and the bus access detection circuit 50 does not detect bus access (NO in S60), the process returns to S57. When bus access is detected by the bus access detection circuit 50 (YES in S60), the process returns to S55 and the idle time counter 202 is reset.

2.4 Effect According to the Second Embodiment

According to the semiconductor device in the second embodiment, in addition to the effect of the first embodiment, when there is no bus access from the CPU 10 for a predetermined time, the frequency of the clock signal supplied to the slave circuit 30 is changed from the first frequency to the second frequency (clock-down), instead of turning off the slave circuit.

When the bus access is performed while the clock signal of the second frequency is being supplied to the slave circuit 30, the clock signal of the first frequency is supplied to the slave circuit 30 (clock-up).

Therefore, even when it takes time for the slave circuit 30 to turn on, the slave circuit 30 is not turned off and thus, the slave circuit 30 can perform a response process to the processing request and so the waiting time for access is shortened and the bus is not kept waiting.

Even when a clock-down of the clock signal supplied to the slave circuit 30 occurs, a clock-up of the clock signal is performed by performing bus access again and so the reduction of the processing efficiency due to the clock-down can be suppressed.

2.5 Modification of the Second Embodiment

As described above, the second embodiment is intended to exercise clock control when the slave circuit 30 is a circuit that takes time for power-on. Therefore, the slave unit SU having the PMB circuit 20 exercising the power supply control in the first embodiment and the slave circuit 30 that does not take time to turn on and the slave unit SU having the PMB circuit 20 in the second embodiment and the slave circuit 30 that takes time to turn on may be combined.

3. Third Embodiment

The semiconductor device according to a third embodiment will be described.

3.1 Configuration of Semiconductor Device

In the first embodiment, when the slave circuit 30 is switched from the on state to the off state, the CPU 10 transmits an off signal to the PMB circuit 20, and the PMB circuit 20 controls the PSW circuit 40 so that the slave circuit 30 is turned off. When the slave circuit 30 is switched from the off state to the on state, the PMB circuit 20 controls the PSW circuit 40 so that the slave circuit 30 is turned on.

In the third embodiment, a PMB circuit 20 outputs a power supply control signal to a power supply controller 70 that controls the voltage supplied to a slave circuit 30 to control the voltage supplied to the slave circuit 30. Hereinafter, only differences from the first embodiment will be described.

FIG. 8 is a block diagram showing the overall configuration of the semiconductor device according to the third embodiment. Incidentally, the same reference signs are attached to the same components as those in FIG. 1 and a duplicate description thereof is omitted.

As shown in FIG. 8, the power supply controller 70 is connected to the PMB circuit 20 of each slave unit SU to control the voltage supplied to the slave circuit 30 of each slave unit SU.

The PMB circuit 20 of each slave unit SU has a register (not shown) indicating whether or not a corresponding slave circuit 30 is a circuit that takes time for power-on. If the slave circuit 30 is a circuit that does not take time to turn on, the on/off control of the power supply in the first embodiment is exercised. If the slave circuit 30 is a circuit that takes time to turn on, the voltage supplied to the slave circuit 30 according to the third embodiment is controlled. In the third embodiment shown in FIG. 8, it is assumed that slave circuits 30_1 to 30_3 are circuits that take time for power-on.

3.2 Configuration of PMB Circuit

Figure 9:
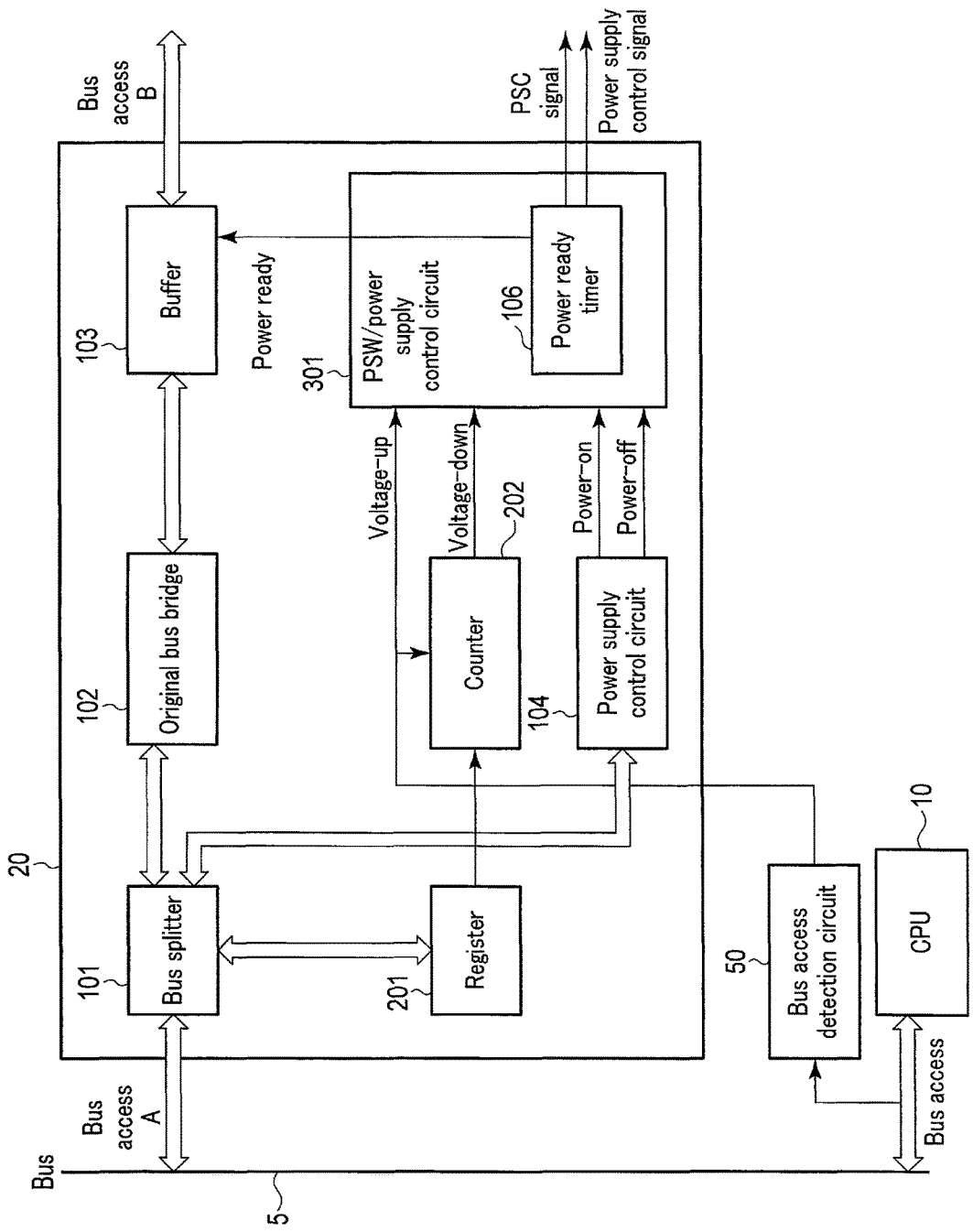
FIG. 9 is a block diagram of a PMB circuit 20 in the semiconductor device according to the third embodiment.

FIG. 9 is a block diagram of the PMB circuit 20 in the semiconductor device according to the third embodiment.

As shown in FIG. 9, the PMB circuit 20 includes a bus splitter circuit 101, an original bus bridge circuit 102, a buffer 103, a PSW/power supply control circuit 301, a configuration register 201, and an idle time counter 202.

The bus splitter circuit 101 is connected to an internal bus 5 (bus access A), the original bus bridge circuit 102, the power supply control circuit 104, and the configuration register 201. When the CPU 10 transmits a PMB control signal, the bus splitter circuit 101 transmits the PMB control signal to the configuration register 201.

The configuration register 201 is connected to the idle time counter 202. The configuration register 201 is a register that holds various settings in the PMB circuit 20. For example, in the configuration register 201, an idle time configuration is set by software (CPU 10). The idle time configuration is a setting value of the idle period from when the slave circuit 30 is put into an idle state to when the power is turned off. When the idle time configuration is changed, the configuration register 201 transmits a new setting value to the idle time counter 202.

The idle time counter 202 is connected to the PSW control circuit 105. The idle time counter 202 is a counter for measuring the length of the idle period. The idle time counter 202 first initializes the counter in accordance with a count start instruction (power-on notification) from the bus access detection circuit 50, and then starts to count. If there is an instruction to start to count again from the bus access detection circuit 50 during counting, the count is restarted. The idle time counter 202 initializes the count value again and then starts to count. When the count value reaches the setting value, counting is stopped. Then, the idle time counter 202 instructs the PSW/power supply control circuit 301 to change the voltage supplied to the slave circuit 30 to a voltage (second voltage) lower than the voltage (first voltage) supplied in the power-on state.

Based on an instruction from the idle time counter 202, the PSW/power supply control circuit 301 outputs a power supply control signal (voltage-down) that changes the voltage supplied to the slave circuit 30 to the second voltage lower than the first voltage to the power supply controller 70. Accordingly, a voltage lower than that in the power-on state is supplied to the slave circuit 30.

Further, when notified of power-on by the bus access detection circuit 50, the PSW/power supply control circuit 301 transmits a power supply control signal (voltage-up) instructing to change the voltage supplied to the slave circuit 30 to the first voltage higher than the second peripheral voltage to the power supply controller 70.

Upon receiving a voltage-down control signal from the PSW/power supply control circuit 301, the power supply controller 70 changes the voltage supplied to the slave circuit 30 from the first voltage to the second voltage, and upon receiving a voltage-up control signal, the power supply controller 70 changes the voltage supplied to the slave circuit 30 from the second voltage to the first voltage.

3.3 Control Operation of Voltage Supplied to Slave Circuit

Figure 10:
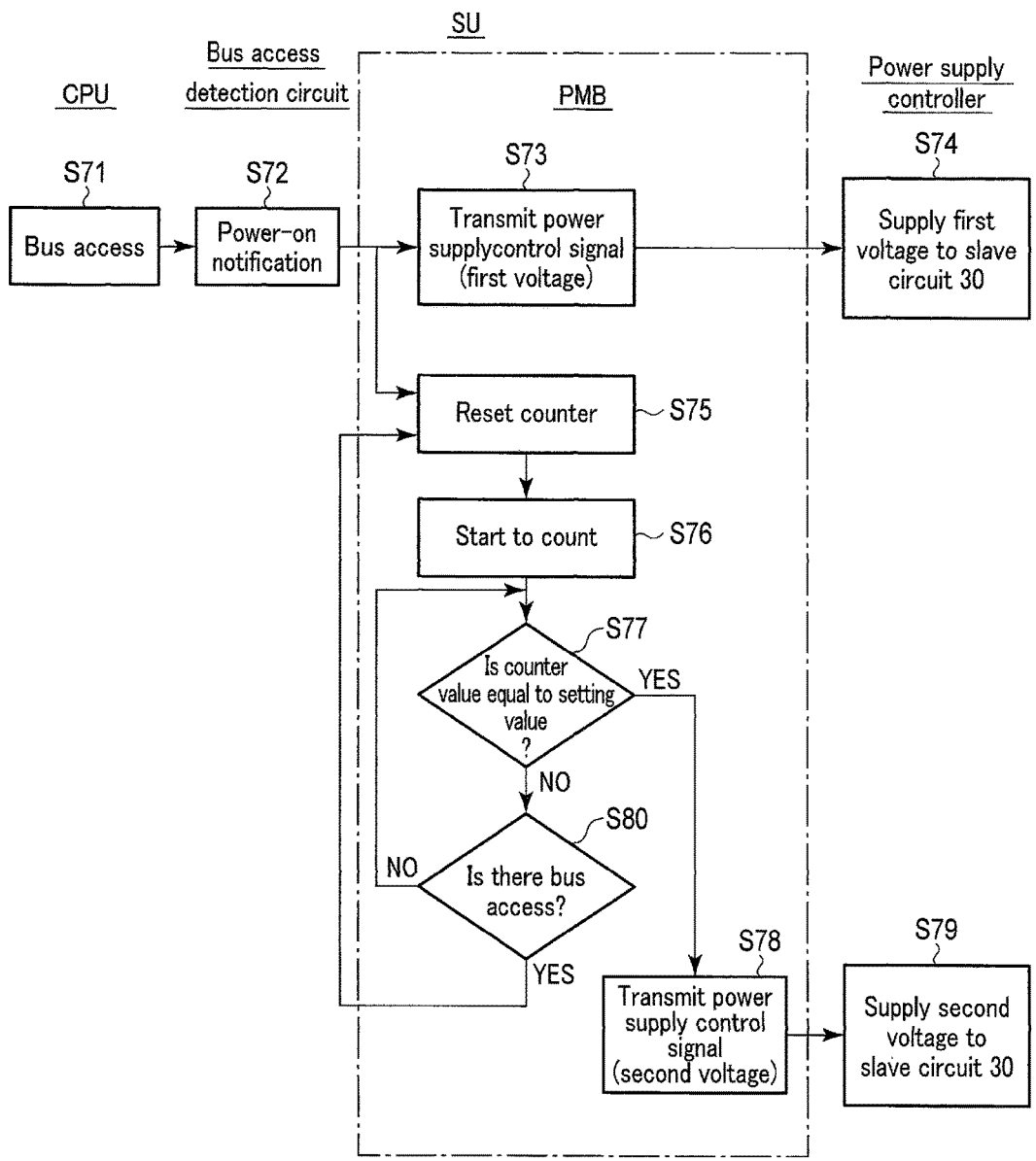
FIG. 10 is a flowchart illustrating a voltage control operation supplied to a slave circuit 30 in the semiconductor device according to the third embodiment.

FIG. 10 is a flowchart illustrating the operation of voltage control supplied to the slave circuit 30 in the semiconductor device according to the third embodiment.

The CPU 10 accesses the internal bus 5 (bus access A) (S71). When the bus access detection circuit 50 detects the access to the internal bus 5 by the CPU 10 on the CPU 10 side without going through the internal bus 5 and the access is detected, the bus access detection circuit 50 notifies the PMB circuit 20 of power-on without going through the internal bus 5 (S72).

When the PMB circuit 20 receives the power-on notification from the bus access detection circuit 50, the PSW/power supply control circuit 301 of the PMB circuit 20 transmits a power supply control signal instructing to change the voltage supplied to the slave circuit 30 from the second voltage to the first voltage to the power supply controller 70 (S73).

Upon receiving the power supply control signal (voltage-up) from the PSW/power supply control circuit 301, the power supply controller 70 changes the voltage supplied to the slave circuit 30 from the second voltage to the first voltage (S74).

On the other hand, when power-on is notified from the bus access detection circuit 50 in S72, the idle time counter 202 of the PMB circuit 20 is initialized (S75), and the counting of the idle time counter 202 is started (S76). That is, when power-on is notified, the process of transmitting the power supply control signal in S73 to the power supply controller 70 and the process of initializing the idle time counter 202 in S75 may be performed in parallel.

When the count value reaches the setting value (YES in S77), the idle time counter 202 stops counting and instructs the PSW/power supply control circuit 301 to change the voltage supplied to the slave circuit 30 to the second voltage lower than the first voltage.

The PSW/power supply control circuit 301 outputs a power supply control signal (voltage-down) to the power supply controller 70 based on the instruction from the idle time counter 202 (S78).

Upon receiving the power supply control signal (voltage-down) from the PSW/power supply control circuit 301, the power supply controller 70 changes the voltage supplied to the slave circuit 30 from the first voltage to the second voltage (S79).

If the counter value is less than the setting value (NO in S77) and the bus access detection circuit 50 does not detect bus access (NO in S80), the process returns to S77. When bus access is detected by the bus access detection circuit 50 (YES in S80), the process returns to S75 and the idle time counter 202 is reset.

3.4 Effect According to the Third Embodiment

According to the semiconductor device in the third embodiment, in addition to the effect of the first embodiment, when there is no bus access from the CPU 10 for a predetermined time, the voltage supplied to the slave circuit 30 is changed from the first voltage to the second voltage (voltage-down), instead of turning off the slave circuit.

Also, when the bus access is performed while the second voltage is being supplied to the slave circuit 30, the first voltage is supplied to the slave circuit 30 (voltage-up).

Therefore, even when it takes time for the slave circuit 30 to turn on, the slave circuit 30 is not turned off and thus, the slave circuit 30 can perform a response process to the processing request and so the waiting time for access is shortened and the bus is not kept waiting.

Even when a voltage-down of the voltage supplied to the slave circuit 30 occurs, a voltage-up is performed by performing bus access again and so the reduction of the processing efficiency due to the voltage-down can be suppressed.

2.5 Modification of the Third Embodiment

As described above, the third embodiment is intended to exercise power supply voltage control when the slave circuit 30 is a circuit that takes time for power-on. Therefore, the slave unit SU having the PMB circuit 20 exercising the power supply control in the first embodiment and the slave circuit 30 that does not take time to turn on and the slave unit SU having the PMB circuit 20 in the third embodiment and the slave circuit 30 that takes time to turn on may be combined.

Also, the slave units SU in the first to third embodiments may be combined so that the slave unit SU is subjected to power supply control, clock frequency control, and power supply voltage control.

Some embodiments of the present invention have been described, but these embodiments are presented as examples and not intended to limit the scope of the invention. These new embodiments can be carried out in other various forms and various omissions, substitutions, and alterations can be made without deviating from the spirit of the invention. These embodiments and modifications thereof are included in the scope and spirit of the invention and also in the scope of the invention described in claims and equivalents thereof.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a control circuit connected to a bus;
a first circuit operating under control of the control circuit;
a bus access detection circuit that detects bus access from the control circuit to the first circuit without going through the bus;
a switch element connected between the first circuit and a power supply; and
a second circuit connected between the first circuit and the bus, the second circuit controlling, when the bus access to the first circuit is detected by the bus access detection circuit, the switch element such that power from the power supply is supplied to the first circuit.

2. The semiconductor device according to claim 1, further comprising:
a third circuit operating under the control of the control circuit, the bus access detection circuit detecting the bus access to the third circuit without going through the bus;
a fourth circuit connected between the third circuit and the bus, the fourth circuit outputting, when the bus access to the third circuit is not detected for a predetermined time by the bus access detection circuit, a clock-down control signal instructing to change a frequency of a clock signal supplied to the third circuit to a second frequency lower than a first frequency of the clock signal supplied when the third circuit is turned on; and
a clock controller that supplies the clock signal of the second frequency to the third circuit based on the clock-down control signal output from the fourth circuit.

3. The semiconductor device according to claim 1, further comprising:
a third circuit operating under the control of the control circuit, the bus access detection circuit detecting the bus access to the third circuit without going through the bus;
a fourth circuit connected between the third circuit and the bus, the fourth circuit outputting, when the bus access to the third circuit is not detected for a predetermined time by the bus access detection circuit, a power supply control signal instructing to change a voltage supplied to the third circuit to a second voltage lower than a first voltage supplied when the third circuit is turned on; and
a power supply controller that supplies the second voltage to the third circuit based on the power supply control signal output from the fourth circuit.

4. The semiconductor device according to claim 1, wherein the second circuit has a bus bridge function that relays access between the first circuit and the bus.

5. The semiconductor device according to claim 1, wherein the bus access detection circuit is provided in common to a slave unit including the first circuit, the switch element, and the second circuit and another slave unit.

6. The semiconductor device according to claim 1, further comprising: another bus access detection circuit that detects bus access from the control circuit to another first circuit without going through the bus, wherein
the bus access detection circuit is provided for a slave unit including the first circuit, the switch element, and the second circuit, and
the other bus access detection circuit is provided for another slave unit.

7. A semiconductor device, comprising:
a control circuit connected to a bus;
a first circuit operating under control of the control circuit;
a bus access detection circuit that detects bus access from the control circuit to the first circuit without going through the bus;
a switch element connected between the first circuit and a power supply;
a second circuit connected between the first circuit and the bus, the second circuit outputting, when the bus access to the first circuit is not detected by the bus access detection circuit for a predetermined time, a clock-down control signal instructing to change a frequency of a clock signal supplied to the first circuit to a second frequency lower than a first frequency of the clock signal supplied when the first circuit is turned on; and
a clock controller that supplies the clock signal of the second frequency to the first circuit based on the clock-down control signal output from the second circuit.

8. The semiconductor device according to claim 7, wherein
when the bus access is detected by the bus access detection circuit, the second circuit outputs a clock-up control signal instructing to change the frequency of the clock signal supplied to the first circuit from the second frequency to the first frequency, and
the clock controller supplies the clock signal of the first frequency to the first circuit based on the clock-up control signal output from the second circuit.

9. The semiconductor device according to claim 7, wherein the second circuit has a bus bridge function that relays access between the first circuit and the bus.

10. The semiconductor device according to claim 7, wherein the bus access detection circuit is provided in common to a slave unit including the first circuit, the switch element, and the second circuit and another slave unit.

11. The semiconductor device according to claim 7, further comprising: another bus access detection circuit that detects bus access from the control circuit to another first circuit without going through the bus, wherein
the bus access detection circuit is provided for a slave unit including the first circuit, the switch element, and the second circuit, and
the other bus access detection circuit is provided for another slave unit.

12. A semiconductor device, comprising:
a control circuit connected to a bus;
a first circuit operating under control of the control circuit;
a bus access detection circuit that detects bus access from the control circuit to the first circuit without going through the bus;
a switch element connected between the first circuit and a power supply;
a second circuit connected between the first circuit and the bus, the second circuit outputting, when the bus access to the first circuit is not detected by the bus access detection circuit for a predetermined time, a power supply control signal instructing to change a voltage supplied to the first circuit to a second voltage lower than a first voltage supplied when the first circuit is turned on; and
a power supply controller that supplies the second voltage to the first circuit based on the power supply control signal output from the second circuit.

13. The semiconductor device according to claim 12, wherein
when the bus access is detected by the bus access detection circuit, the second circuit outputs a power supply control signal instructing to change the voltage supplied to the first circuit from the second voltage to the first voltage, and
the power supply controller supplies the first voltage to the first circuit based on the power supply control signal output from the second circuit.

14. The semiconductor device according to claim 12, wherein the second circuit has a bus bridge function that relays access between the first circuit and the bus.

15. The semiconductor device according to claim 12, wherein the bus access detection circuit is provided in common to a slave unit including the first circuit, the switch element, and the second circuit and another slave unit.

16. The semiconductor device according to claim 12, further comprising: another bus access detection circuit that detects bus access from the control circuit to another first circuit without going through the bus, wherein
the bus access detection circuit is provided for a slave unit including the first circuit, the switch element, and the second circuit, and
the other bus access detection circuit is provided for another slave unit.

* * * * *